(12) United States Patent
Babakhani et al.

(10) Patent No.: US 10,191,454 B2
(45) Date of Patent: Jan. 29, 2019

(54) METHODS AND RELATED SYSTEMS OF ULTRA-SHORT PULSE DETECTION

(71) Applicant: WILLIAM MARSH RICE UNIVERSITY, Houston, TX (US)

(72) Inventors: Aydin Babakhani, Houston, TX (US); Babak Jamali, Houston, TX (US)

(73) Assignee: William Marsh Rice University, Houston, TX (US)

( * ) Notice: Subject to any disclaimer, the term of this patent is extended or adjusted under 35 U.S.C. 154(b) by 11 days.

(21) Appl. No.: 15/621,137

(22) Filed: Jun. 13, 2017

(65) Prior Publication Data
US 2017/0357220 A1 Dec. 14, 2017

Related U.S. Application Data

(60) Provisional application No. 62/349,360, filed on Jun. 13, 2016.

(51) Int. Cl.
| G04F 10/00 | (2006.01) |
| G04F 13/02 | (2006.01) |
| H04B 10/60 | (2013.01) |
| H04L 27/227 | (2006.01) |
| H01S 3/11 | (2006.01) |
| H01S 5/065 | (2006.01) |

(52) U.S. Cl.
CPC ............ *G04F 13/026* (2013.01); *G04F 10/00* (2013.01); *H01S 3/11* (2013.01); *H01S 5/065* (2013.01); *H04B 10/60* (2013.01); *H04L 27/2276* (2013.01)

(58) Field of Classification Search
None
See application file for complete search history.

(56) References Cited

U.S. PATENT DOCUMENTS

| 4,405,925 A | * | 9/1983 | Lindner | .................... G01S 7/03 |
| | | | | 342/175 |
| 4,413,905 A | * | 11/1983 | Holzapfel | ............. G04F 13/026 |
| | | | | 356/28 |

(Continued)

FOREIGN PATENT DOCUMENTS

| WO | WO 2015105546 A2 | * | 7/2015 | ......... E21B 47/0002 |
| WO | WO-2015105546 A2 | * | 7/2015 | ......... E21B 47/0002 |

OTHER PUBLICATIONS

M. Assefzadeh and A. Babakhani, "An 8-psec 13dBm Peak EIRP Digital-to-Impulse Radiator with an On-chip Slot Bow-Tie Antenna in Silicon," IEEE MTT-S Int. Microwave Symp. Dig., Jun. 2014, 4 pages.*

(Continued)

*Primary Examiner* — Berhanu Tadese
(74) *Attorney, Agent, or Firm* — Dickinson Wright PLLC; Ross Spencer Garsson; Mark E. Scott (57) ABSTRACT

Ultra-short pulse detection. At least some example embodiments are methods including: receiving by an antenna a series of ultra-short pulses of electromagnetic energy at a repetition frequency, the receiving creates a pulse signal; self-mixing or intermodulating the pulse signal by applying the pulse signal to a non-linear electrical device, thereby creating a modulated signal; and filtering the modulated signal to recover a filtered signal having an intermodulated frequency being the repetition frequency.

20 Claims, 6 Drawing Sheets

(56) References Cited

U.S. PATENT DOCUMENTS

| | | | | |
|---|---|---|---|---|
| 4,733,403 A * | 3/1988 | Simone | H03D 3/007 | 327/556 |
| 4,893,316 A * | 1/1990 | Janc | H03C 3/40 | 341/110 |
| 5,998,781 A * | 12/1999 | Vawter | H03C 1/34 | 250/227.11 |
| 6,385,439 B1 * | 5/2002 | Hellberg | H03D 7/165 | 455/118 |
| 6,426,716 B1 * | 7/2002 | McEwan | G01S 13/04 | 329/311 |
| 6,646,449 B2 * | 11/2003 | Seppinen | H04B 1/1027 | 324/624 |
| 6,690,247 B2 * | 2/2004 | Kintis | H03K 5/12 | 307/106 |
| 7,268,705 B2 * | 9/2007 | Kong | G06F 3/0202 | 341/31 |
| 7,283,214 B2 * | 10/2007 | Xu | G01C 3/08 | 356/5.01 |
| 7,505,033 B2 * | 3/2009 | Guo | G06F 3/0317 | 345/156 |
| 7,528,824 B2 * | 5/2009 | Kong | G06F 3/0202 | 341/22 |
| 7,543,750 B2 * | 6/2009 | Kong | G06K 7/10851 | 235/462.01 |
| 7,557,795 B2 * | 7/2009 | Kong | G06F 3/0312 | 345/156 |
| 8,416,424 B2 * | 4/2013 | Werner | G01S 7/4811 | 356/488 |
| 8,849,611 B2 * | 9/2014 | Haviland | B82Y 35/00 | 250/234 |
| 8,885,247 B2 * | 11/2014 | Letartre | B82Y 20/00 | 359/326 |
| 9,780,889 B1 * | 10/2017 | Margulis | H04B 17/11 | |
| 2004/0072547 A1 * | 4/2004 | Axness | H03G 3/3052 | 455/130 |
| 2004/0152435 A1 * | 8/2004 | Pellat | H03D 7/145 | 455/199.1 |
| 2006/0052988 A1 * | 3/2006 | Farahani | H04B 17/391 | 703/2 |
| 2006/0058606 A1 * | 3/2006 | Davis | A61B 5/05 | 600/407 |
| 2006/0088259 A1 * | 4/2006 | Weiner | G01J 11/00 | 385/122 |
| 2007/0033000 A1 * | 2/2007 | Farahani | G06F 17/11 | 703/28 |
| 2007/0104230 A1 * | 5/2007 | Kopf | H01S 3/1103 | 372/9 |
| 2007/0105522 A1 * | 5/2007 | Muhammad | H03D 3/008 | 455/326 |
| 2008/0224869 A1 * | 9/2008 | Kaplan | G06K 7/10306 | 340/572.1 |
| 2008/0249417 A1 * | 10/2008 | Averkiou | A61B 8/00 | 600/459 |
| 2009/0034658 A1 * | 2/2009 | Lu | H04L 27/06 | 375/320 |
| 2009/0068974 A1 * | 3/2009 | Smith | H04B 1/30 | 455/304 |
| 2010/0076700 A1 * | 3/2010 | Dabbicco | G01B 11/16 | 702/42 |
| 2010/0093298 A1 * | 4/2010 | Pratt | H04B 1/109 | 455/226.1 |
| 2010/0221015 A1 * | 9/2010 | Williams | G01S 3/22 | 398/115 |
| 2010/0303106 A1 * | 12/2010 | Kopf | H01S 3/0057 | 372/18 |
| 2011/0057740 A1 * | 3/2011 | Nicole | H03G 11/002 | 333/17.2 |
| 2011/0168891 A1 * | 7/2011 | van der Weide | G01J 3/02 | 250/334 |
| 2011/0275341 A1 * | 11/2011 | Landmark | H04B 1/109 | 455/318 |
| 2012/0176595 A1 * | 7/2012 | Van Der Lee | G01S 7/483 | 356/4.09 |
| 2012/0275549 A1 * | 11/2012 | Crepaldi | H04B 1/7163 | 375/342 |
| 2012/0326912 A1 * | 12/2012 | Aoyagi | G01S 7/023 | 342/21 |
| 2013/0244583 A1 * | 9/2013 | Dhayni | G01R 29/10 | 455/67.14 |
| 2013/0303103 A1 * | 11/2013 | Mikhemar | H04B 1/123 | 455/303 |
| 2014/0217288 A1 * | 8/2014 | Kamata | G01N 21/63 | 250/338.4 |
| 2016/0299014 A1 * | 10/2016 | Li | G01K 11/24 | |
| 2016/0327478 A1 * | 11/2016 | Hilscher | B07C 5/3425 | |
| 2016/0344108 A1 * | 11/2016 | Assefzadeh | H01Q 3/2682 | |
| 2016/0352369 A1 * | 12/2016 | Smith | H04B 1/1036 | |
| 2017/0357220 A1 * | 12/2017 | Babakhani | G04F 10/00 | |
| 2018/0175905 A1 * | 6/2018 | Nabki | H04L 7/00 | |
| 2018/0217008 A1 * | 8/2018 | Li | G01K 11/24 | |

OTHER PUBLICATIONS

M. Assefzadeh and A. Babakhani, "Broadband 0.03-1.032THz Signal Generation and Radiation Based on a rully- Integrated 4x2 Impulse Radiating Array in 90nm SiGe BiCMOS," 2016 41st International Conference on Infrared, Millimeter, and Terahertz waves (IRMMW-THz), Copenhagen, 2016,2 pages.*

Chen and A. Babakhani, "Wireless Synchronization of mm-wave Arrays in 65nm CMOS," IEEE CICC Dig., Sep. 2015,4 pages.*

Gou, et al., "A Receiver with Start-up Initialization and Programmable Delays for Wireless Clock Distribution," 2006 EEE International Solid-State Circuits Conference, ISSCC Dig. Tech Papers, Feb. 2006,10 pages.*

M. Assefzadeh et al. A 9-psec Differential Lens-Less Digital-to-Impulse Radiator with A Programmable Delay Line in Silicon. 2014 IEEE Radio Frequency Integrated Circuits Symposium, pp. 307-310.*

Sasaski, et al., "A Single-Chip Ultra-Wideband Receiver With Silicon Integrated Antennas for Inter-Chip Wireless nterconnection," IEEE Journal of Solid-State Circuits, vol. 44, No. 2, pp. 382-393, Feb. 2009,12 pages.*

Yang, et al., "Picosecond Wireless Synchronization Using an Optically Locked Voltage Controlled Oscillator (OL-/CO)," IEEE MTT-S Int. Microwave Symp. Dig., Jun. 2014,4 pages.*

T. Li, H. Zhai, L. Li and C. Liang, "Frequency-Reconfigurable Bow-Tie Antenna With a Wide Tuning Range," in IEEE Antennas and Wireless Propagation Letters, vol. 13, pp. 1549-1552, 2014.*

M.M. Assefzadeh and A. Babakhani, "An 8-psec 13dBm Peak EIRP Digital-to-Impulse Radiator with an On-chip Slot Bow-Tie Antenna in Silicon," IEEE MTT-S Int. Microwave Symp. Dig., Jun. 2014, 4 pages.

M.M. Assefzadeh and A. Babakhani, "Broadband 0.03-1 .032THz Signal Generation and Radiation Based on a Fully-Integrated 4x2 Impulse Radiating Array in 90nm SiGe BiCMOS," 2016 41st International Conference on Infrared, Millimeter, and Terahertz waves (IRMMW-THz), Copenhagen, 2016, 2 pages.

C. Chen and A. Babakhani, "Wireless Synchronization of mm-wave Arrays in 65nm CMOS," IEEE CICC Dig., Sep. 2015, 4 pages.

X. Gou, et al., "A Receiver with Start-up Initialization and Programmable Delays for Wireless Clock Distribution," 2006 IEEE International Solid-State Circuits Conference, ISSCC Dig. Tech Papers, Feb. 2006, 10 pages.

"Intermodulation," Wikipedia, https://en.wikipedia.org/wiki/Intermodulation, last edited Feb. 16, 2017, 6 pages.

N. Sasaski, et al., "A Single-Chip Ultra-Wideband Receiver With Silicon Integrated Antennas for Inter-Chip Wireless Interconnection," IEEE Journal of Solid-State Circuits, vol. 44, No. 2, pp. 382-393, Feb. 2009, 12 pages.

X. Yang, et al., "Picosecond Wireless Synchronization Using an Optically Locked Voltage Controlled Oscillator (OL-VCO)," IEEE MTT-S Int. Microwave Symp. Dig., Jun. 2014, 4 pages.

* cited by examiner

METHODS AND RELATED SYSTEMS OF ULTRA-SHORT PULSE DETECTION

CROSS-REFERENCE TO RELATED APPLICATIONS

This application claims the benefit of U.S. Provisional Application No. 62/349,360 filed 13 Jun. 2016, titled "Ultra-Short Pulse Detection Based on a Nonlinear Self-Mixing Scheme," which provisional application is incorporated by reference herein as if reproduced in full below.

GOVERNMENT INTEREST

None.

BACKGROUND

Distribution of clock signals to multiple interrelated components is a challenging endeavor as clock frequencies increase. For example, in computer systems high speed clock signals propagate along metallic traces such that each individual distributed element of the computer system is provided a suitable clock signal. However, clock signals are subject to reflections, interference, standing wave phenomenon, and signal degradation, and thus the engineering aspects of clock distribution along metallic traces is an area of specialization in engineering in-and-of itself. Relatedly, where multiple spatially distributed objects need a uniform clock signal (e.g., individual receiving elements of a multi-element electromagnetic receiving antenna array), providing a uniform clock signal to the spatially distributed objects is challenging.

Some solutions attempt to distribute the clock among multiple distributed elements wirelessly by broadcasting a continuous wave source, with the distributed element receiving the continuous wave source and producing a clock signal therefrom. However, a wirelessly broadcast continuous wave source is subject to the multi-path phenomenon, where the versions of the signal arrive at the distributed element after taking different paths (e.g., direct path, reflection off buildings or the sky). Thus, the received signal may have significant timing jitter.

SUMMARY

At least some of the example embodiments are methods including: receiving by an antenna a series of pulses of electromagnetic energy, each pulse having a pulse width of 100 picoseconds (ps) or less (e.g., 10 ps, or 8 ps), the series of pulses having a repetition frequency of greater than 100 Mega-Hertz (e.g., between 1 Giga-Hertz (GHz) and 10 GHz inclusive), and the electromagnetic energy at a carrier frequency of 10 GigaHertz (GHz) or above, the receiving creates a pulse signal; intermodulating the pulse signal by applying the pulse signal to a non-linear electrical device, the intermodulation creates a modulated signal; filtering the modulated signal to recover a filtered signal having an intermodulated frequency being repetition frequency.

Other example embodiments electrical devices including: a substrate that defines a length and width; an antenna disposed on the substrate, the antenna has a center frequency above 10 GigaHertz (GHz); a broadband amplifier disposed on the substrate, the broadband amplifier defines an input lead and an output lead, the input lead coupled to the antenna; a non-linear electrical device disposed on the substrate, the non-linear electrical device defines an input lead and an output lead, the input lead of the non-linear electrical device coupled to the output lead of the broadband amplifier; an electrical filter disposed on the substrate, the electrical filter defines an input lead and an output lead, the input lead of the electrical filter coupled to the output lead of the non-linear electrical device, and the electrical filter has upper cutoff frequency of about 10 GHz; and a baseband amplifier disposed on the substrate, the baseband amplifier defines an input lead and an output lead, the input lead of the baseband amplifier coupled to the output lead of the electrical filter.

BRIEF DESCRIPTION OF THE DRAWINGS

For a detailed description of example embodiments, reference will now be made to the accompanying drawings (not necessarily to scale) in which.

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Non-linear" in reference to an electrical device shall mean that a relationship of an input signal applied to the electrical device and a corresponding output signal created by the electrical device does not have a straight-line line relationship, but is continuous.

"Bow-tie antenna" shall mean an antenna that resides in a plane, and when the antenna is viewed from above the plane along a line perpendicular to the plane and centered within the bow-tie antenna, the bow-tie antenna takes the shape of a bow tie (e.g., two triangles whose apices point toward each other).

"Varactor diode defines a first capacitance and a second capacitance" shall mean that varactor diode, based on externally applied voltage, may have the first capacitance or the second capacitance, but shall not be read to require both the first and second capacitance simultaneously present.

"About" shall mean the recited value plus or minus 10% of the recited value.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various embodiments are directed to methods and related systems for receiving pico-second width pulses of electromagnetic energy (e.g., where the electromagnetic energy has frequency of above 10 GigaHertz (GHz), and the pulses have a repetition frequency greater than 100 Mega-Hertz (MHz)), and recovering therefrom a clock signal. More specifically, various embodiments rely on self-mixing or intermodulation to extract a clock signal at the repetition frequency to be used at remotely distributed objects or elements. The discussion first turns to an example system.

Figure 1:
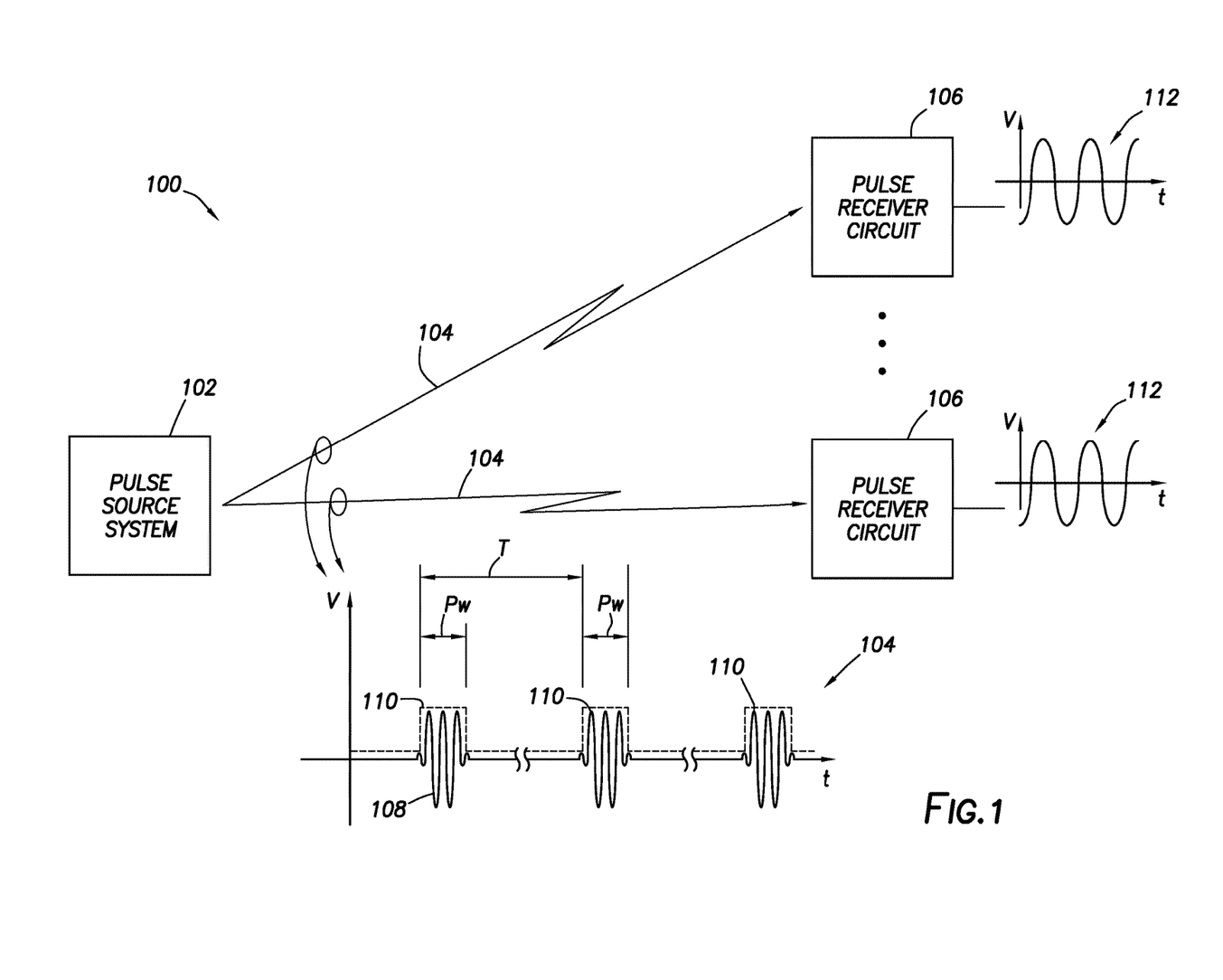
FIG. 1 shows a block diagram of a system in accordance with at least some embodiments.

FIG. 1 shows a block diagram of a system in accordance with at least some embodiments. In particular, system 100 comprises a pulse source system 102. The pulse source system 102 sends a pulse signal 104 comprising an electromagnetic wave propagating through air (or other medium) to one or more pulse receiver circuits 106. While the figure shows the pulse signal 104 as two arrows, it will be understood that the pulse signal 104 in the form of an electromagnetic wave takes the form of wave-fronts of electromagnetic energy expanding outward from the pulse source system 102 and ultimately propagating to each pulse receiver circuit 106. FIG. 1 shows the pulse signal 104 as two arrows so as not to unduly complicate the figure, and to exemplify that each pulse receiver circuit 106 receives at least a portion of the energy of the pulse signal 104 created by the pulse source system 102.

The pulse source system 102 may take any suitable form. In some cases, the pulse source system 102 is a dedicated impulse radiator, such as the device described in the Institute of Electrical and Electronic Engineers (IEEE) paper by M. Mandi Assefzadeh and Aydin Babakhani titled "An 8-psec 13 dBm peak EIRP digital-to-impulse radiator with on-chip slot bow-tie antenna in silicon" published in the papers of the International Microwave Symposium (IMS), 2014 IEEE MTT-S International (conference held 1-6 Jun. 2014). In other cases, the pulse source system 102 may create the pulse signal 104 by interference of two separately broadcast electromagnetic sources (e.g., one signal at 46 GHz and the second at 48 GHz, or one signal at 43 GHz and the second at 49GHz, or one signal at 43 GHz and the second signal at 53 GHz). The constructive and destructive interference between the two sources creates the pulse signal.

Inset within FIG. 1 is an idealized time-domain representation or graph of the pulse signal 104. In particular, in the graph the ordinate is voltage (V) and the abscissa is time (t). Shown is a periodic signal 108 used to create pulses of energy. In example systems, when the amplitude is non-zero the periodic signal 108 has a frequency (sometimes referred to as a carrier frequency) of 10 GHz or above, and in some between about 40 GHz and about 60 GHz. It is noted that FIG. 1 is not to scale, and thus the number of cycles of the periodic signal 108 shown in relation to further example parameters discussed below (e.g., pulse width) are not necessarily to scale. In the idealized time-domain representation, pulses of energy of the periodic signal 108 are shown as ideal square-wave pulses 110 by way of a dashed line superimposed over the absolute value of the amplitude (i.e., the amplitude envelope) of the periodic signal 108. However, in practice the amplitude envelope will not be the idealized square-wave shown, but the idealized square-wave representation is helpful in describing other parameters of interest. The pulses of energy have a pulse width ($P_W$) defined between any consistent features of a pulse 110. For example, the pulse width may be defined between first movement of the signal and last movement of the signal as shown in the drawings. Because of noise, first movement and last movement may be difficult to discern, and thus other trigger features are possible. Thus, other examples of features defining the pulse width may comprise: the first zero crossing and the last zero crossing of the periodic signal; the first positive peak and the last positive peak of the periodic signal; or the time between the half-power points of the rising and falling signal. Regardless of the features used to define the pulse width, in example systems the pulse width is 100 picoseconds (ps) or less, in some cases 10 ps or less, and in a specific example case about 8 ps.

Still referring to FIG. 1, the idealized time-domain representation further shows the repetition rate or period T measured between consistent features of two contiguous pulses. For example, the period T may be measured between: first movement of the first pulse and first movement of the second pulse (approximately as shown in the figure); or the last movement of the first pulse and last movement of the second pulse. Because of noise, the first movements and last movements may be difficult to discern, and other trigger features are possible. Thus, other examples of features defining the period T may comprise: first zero crossings; last zero crossings; first positive peaks; last positive peaks; or the time between respective the half-power points. The period T implies a repetition frequency of the pulses of the periodic signal 108, the repetition frequency of the pulses being the inverse of the period T (i.e., repetition frequency of the pulses $f_P=1/T$). In example cases, the repetition frequency is greater than 100 MHz, in some cases greater than 1 GHz, and in other cases the repetition frequency is between 1 GHz and 10 GHz inclusive.

Still referring to FIG. 1, each pulse receiver circuit 106 receives a portion of the energy of the pulse signal 104, and creates or recovers therefrom a clock signal 112. In the example systems, the clock signal 112 has a frequency being the repetition frequency of the pulses 110. Considering the case of the pulse signal 104 created by interference of two separately broadcast electromagnetic sources, the frequency of the clock signal 112 is the difference in frequency between the two broadcast electromagnetic sources (more specifically, the absolute value of the difference in frequency between the two broadcast electromagnetic sources to avoid negative frequencies). For example, when one signal broadcasts at 46 GHz and the second broadcasts at 48 GHz, the repetition frequency and thus the frequency of the clock signal is 2 GHz. When one signal broadcasts 43 GHz and the second broadcasts at 49GHz, the clock signal has a frequency of 6 GHz. Finally, when one signal broadcasts at 43 GHz and the second broadcasts at 53 GHz, the clock signal has a frequency of 10 GHz. The specification now turns to explanation of an example pulse receiver circuit 106.

Figure 2:
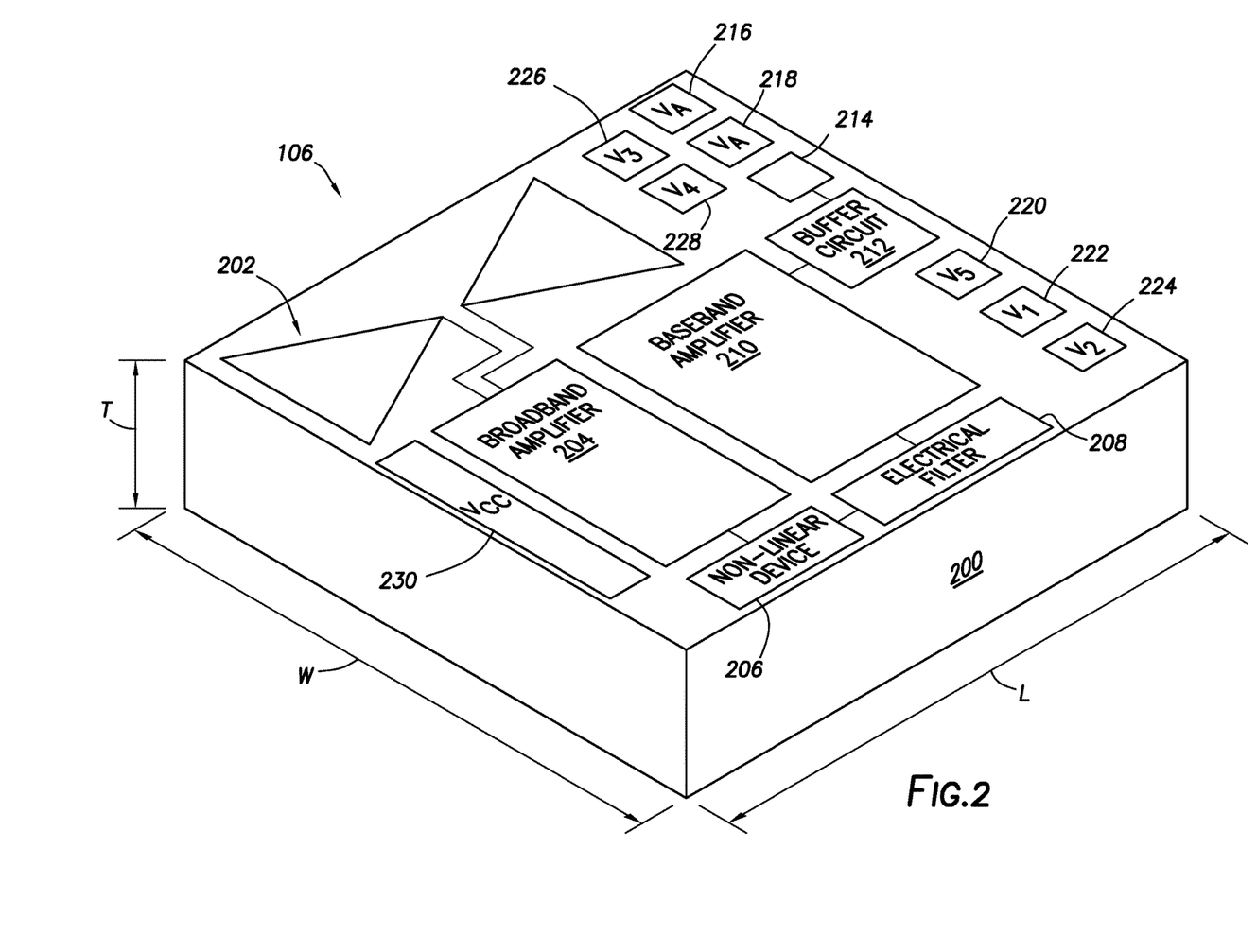
FIG. 2 shows a perspective view of an electrical device in accordance with at least some embodiments.

FIG. 2 shows a perspective view of an electrical device implementing a pulse receiver circuit 106 in accordance with at least some embodiments. In particular, FIG. 2 shows a substrate 200 that defines a length L, a width W, and a thickness T. In example cases, the substrate is a silicon substrate, and the various devices constructed thereon implement the functionality. For example, the various transistor devices may be implemented in the form of 0.13 micrometer (μm) Silicon-Germanium (SiGe) Bi-Complementary metal oxide semiconductor (BICMOS) technology. In example cases, the length L and width W are each 2.0 millimeters (mm) or less, and in a specific example system the total area (i.e., length L times width W) is 1.89 mm². For purposes of explanation the various devices are conceptually divided into an antenna 202, a broadband amplifier 204 (shown in block diagram form), a non-linear electrical device 206 (shown in block diagram form), an electrical filter 208 (shown in block diagram form), a baseband amplifier 210 (shown in block diagram form), and a buffer circuit 212 (shown in block diagram form). The antenna 202 is electrically coupled to the broadband amplifier 204. The broadband amplifier 204 is electrically coupled to the non-linear electrical device 206. The non-linear electrical device 206 is electrically coupled to the electrical filter 208. The electrical filter is electrically coupled to the baseband amplifier 210. The baseband amplifier 210 is electrically coupled to the buffer circuit 212. The buffer circuit 212 produces the clock signal 112 (FIG. 1), which clock signal may be electrically coupled off the device by way of the bond pad 214. As will be discussed more below, various aspects of the pulse receiver circuit 106 may be controllable or adjustable (e.g., bias voltages, amplifier center frequency adjustments), and thus the substrate further comprises bond pads 216, 218, 220, 222, 224, 226 and 228 to which tuning and bias signals (e.g., voltages) may be applied. A supply voltage $V_{CC}$ may also be applied by way of pad 230. Each of the components will be discussed in turn, starting with the antenna 202.

Antenna 202 is a metallic material disposed on the substrate and designed to receive propagating electromagnetic energy (e.g., propagating through air). In example systems, the antenna 202 is a broadband antenna with a center frequency above about 10 GHz, in one case the center frequency of the antenna 202 is between about 40 GHz and about 60 GHz, and in a specific example case the center frequency of the antenna 202 is about 50 GHz. As shown in the example system, the antenna 202 may be implemented as a bow-tie antenna, but any antenna design that can suitably receive electromagnetic energy at the frequency of the periodic signal 108 (FIG. 1), as well as within a range of frequencies around the frequency of the periodic signal 108, may be used. The antenna 202 thus receives and creates an electrical version of the pulse signal. The antenna 202 couples to the broadband amplifier 204.

Figure 3:
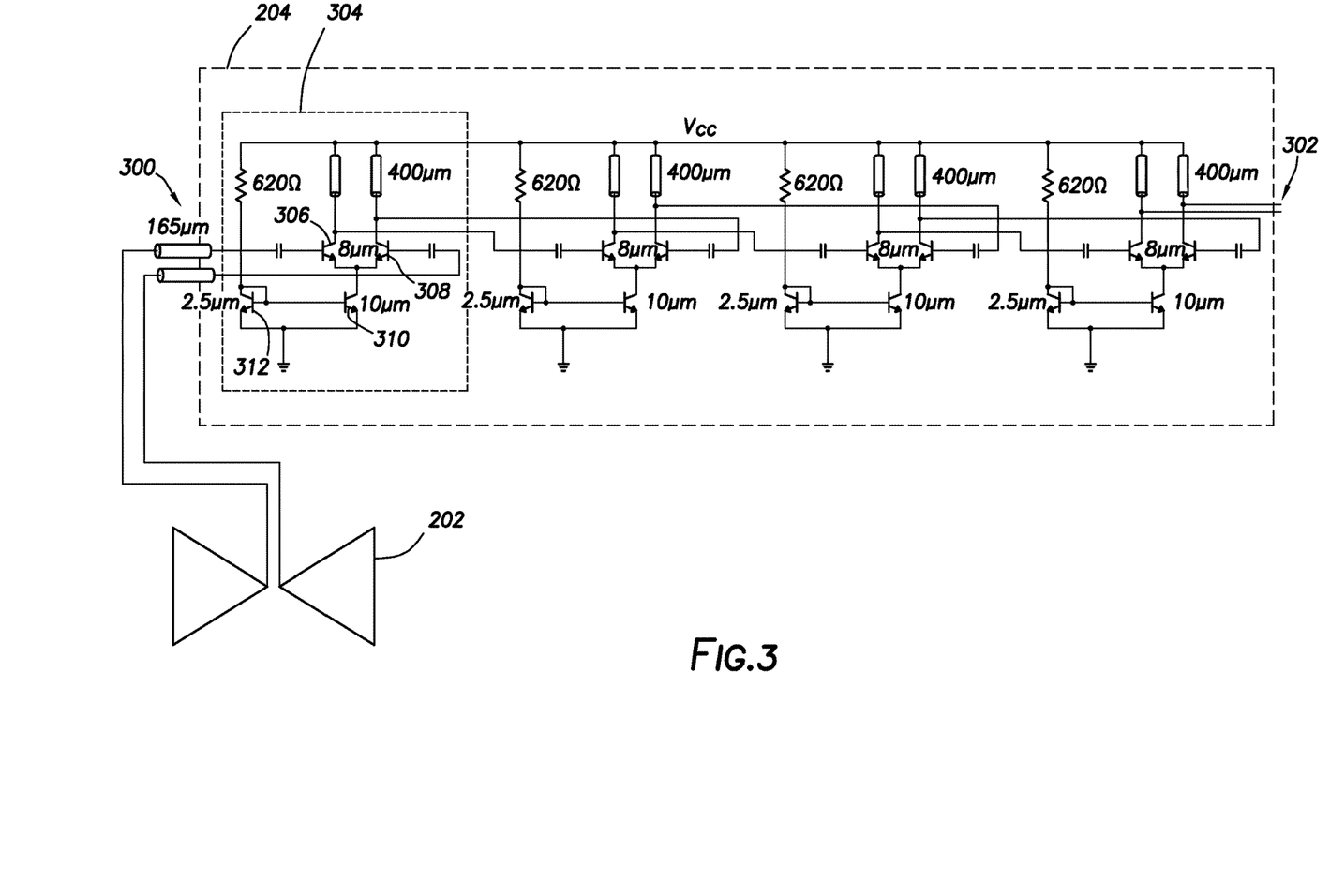
FIG. 3 shows a circuit diagram of a broadband amplifier in accordance with at least some embodiments.

Broadband amplifier 204 is disposed on the substrate and electrically couples to the antenna 202. FIG. 3 shows a circuit diagram of a broadband amplifier 204 in accordance with at least some embodiments (and also includes the antenna 202 for convenience of the discussion). In particular, the broadband amplifier 204 defines input leads 300 and output leads 302. The input leads 300 are coupled to the antenna 300 by way of circuit traces, and in an example case the circuit traces have lengths of 167 μm. The example broadband amplifier 204 of FIG. 3 is designed and constructed to have a peak gain of about 28 deci-Bells (dB) in the frequency range of about 40 GHz to about 60 GHz, and a center frequency of 50 GHz. The example broadband amplifier 204 comprises four identical stages, but only one stage 304 is specifically delineated. The main elements of the example stage 304 are two Bipolar Junction Transistors (BJTs) 306 and 308 (here NPN transistors, and hereafter just transistors 306 and 308) arranged in a push-pull configuration. The 8 μm dimension shown on the drawing designates the emitter width of each of the transistors 306 and 308 in the example circuit. Throughout the NPN various drawings lengths depicted proximate to BJT transistors designate the respective emitter widths (or drain widths for field effect transistors (FETS)). The amplifiers 306 and 308 are coupled to the voltage source $V_{CC}$ through electrical traces of the noted lengths, and are coupled to return or ground by way of transistor 310. Transistor 310 cooperates with transistor 312 to provide a non-zero bias voltage at the emitters of the transistors 308 and 306 in spite of small swings in the voltage source $V_{CC}$. The non-zero bias voltage at the emitters is provided such that the amplified signal created by the stage 304 rides the non-zero bias voltage (and thus eliminating the need for a negative $V_{CC}$). The output signal from the stage 304 feeds next stage (not specifically delineated), and so on through the example four stages of the broadband amplifier 204, thus producing an amplified version of the electrical pulse signal.

Figure 4:
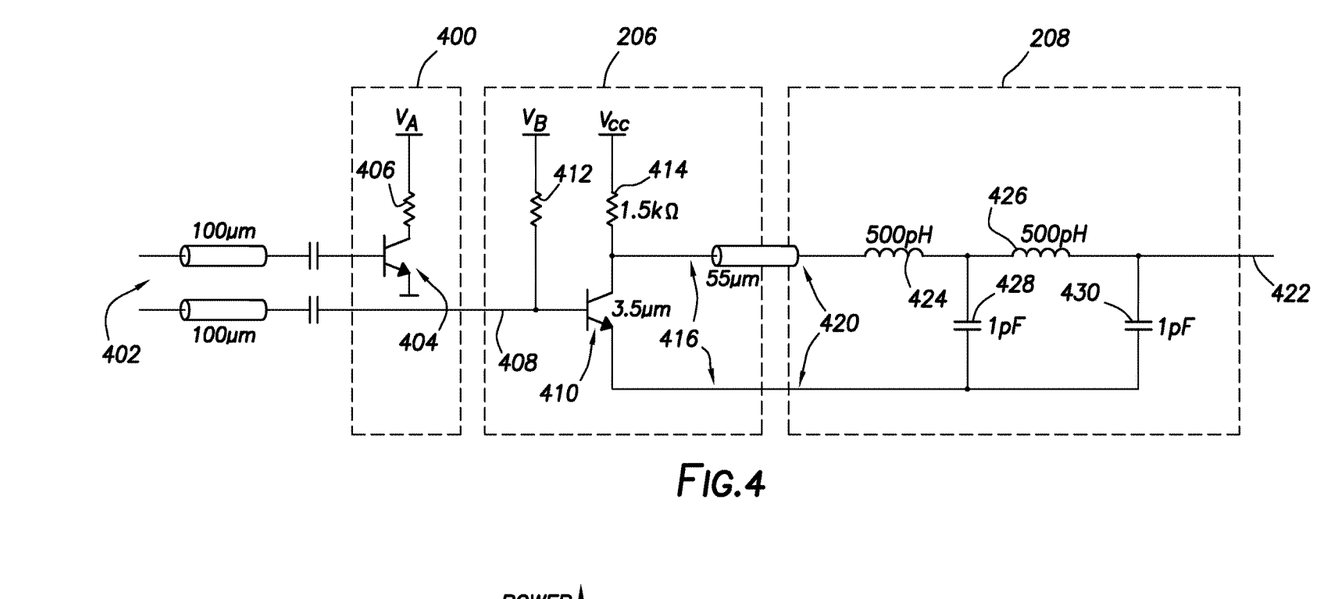
FIG. 4 shows a circuit diagram of a non-linear electrical device and electrical filter in accordance with at least some embodiments.

FIG. 4 shows a circuit diagram of a non-linear electrical device 206 and electrical filter 208 in accordance with at least some embodiments. In particular, the circuits of FIG. 4 couple to the output leads 302 (FIG. 3) of the broadband amplifier 204. In the example circuit, the coupling to the broadband amplifier 204 is by way of electrical traces on the substrate having lengths of 100 μm as shown. The example circuit of FIG. 4 also shows a load balancing circuit 400. As the name implies, the load balancing circuit 400 balances the impedance as between the two leads 402. The example load balancing circuit 400 comprises an NPN transistor 404 having its collector coupled to a voltage $V_A$ by way of a resistor 406. The base of the transistor 404 is coupled to one of the leads 402, and the emitter of the transistor 404 is capacitively coupled to the second of the leads 402. In some cases, the voltage $V_A$ is coupled to $V_{CC}$ within the pulse receiver circuit, but in other cases the voltage $V_A$ may be externally applied (such as by way of bond pad 216) such that the load balancing may be externally controlled. The load balancing circuit thus creates a single lead that becomes the input lead 408 of the non-linear electrical device 206.

The non-linear electrical device 206 in the example systems is a BJT (NPN) transistor 410 having an emitter width of 3.5 μm. The base of the transistor 410 receives a bias electrical current by virtue of the base being coupled to a bias voltage $V_B$ by way of resistor 412. In example cases, the bias voltage $V_B$ is externally supplied by way of one of the bond pads (e.g., bond pad 218). The transistor 410 has its collector coupled to $V_{CC}$ by way of resistor 414, in this example case having a resistance of 1.5 kOhms. The collector and emitter thus define the output leads 416 of the non-linear electrical device 206.

In the example system, the amplified electrical pulse signal applied to the non-linear electrical device 206 creates a modulated signal on the output leads 416. A description of the modulated signal relies on a description of the frequency components of the pulse signal.

Figure 5:
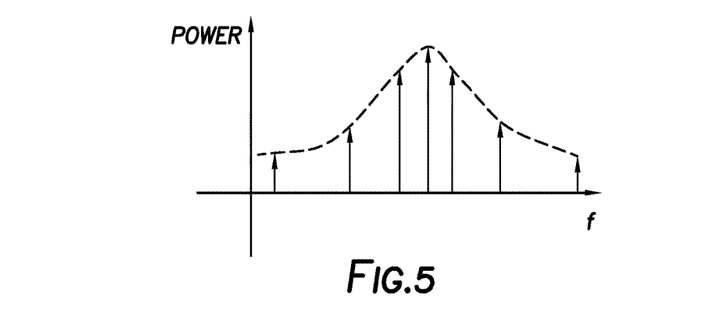
FIG. 5 shows a frequency domain plot of the power spectrum of the electrical pulse signal in accordance with at least some embodiments.

FIG. 5 shows a frequency domain plot of the power spectrum of the electrical pulse signal. In order to explain the relevance of FIG. 5, consider that a single and short (e.g., 8 ps) pulse of energy has a Gaussian-like continuous spectrum that may include frequencies into the Tera-Hertz range. However, when the pulses are created with a fixed period T (see the time domain representation of FIG. 1), the frequency spectrum becomes a Gaussian-modulated "comb" structure as shown in FIG. 5. That is, the frequency spectrum largely resolves to individual and discrete frequency components as shown in FIG. 5. Hold that thought. In electronic devices, when a signal comprising two or more frequencies is applied to a non-linear electrical device, the output signal of the non-linear electrical device includes a parasitic effect in the form of intermodulation. That is, the two or more frequencies interact through the non-linear electrical device to create harmonic signals with frequency components being the sum and difference of the two frequencies, and integer multiples of the sum and difference. In most cases, the harmonics are parasitic and are removed by filtering. In accordance with various embodiments, however, the otherwise parasitic harmonics are utilized.

Returning to FIG. 4, when applied to the non-linear electrical device 206 the electrical pulse signal (comprising the frequency spectrum of the Gaussian-modulated comb of FIG. 5) produces harmonics, one harmonic being the repetition frequency of the pulses 110. In the example case of FIG. 4, the transistor 410 is biased by way of the $V_B$ and resistor 412 into a non-linear region such that the modulated signal existing between the output leads 416 includes a component with a frequency being the repetition frequency of the pulses 110 (among others). In an example case of the pulse stream being created by the interference of two electromagnetic waves as discussed above (e.g., 43 GHz and 49 GHz), non-linear electrical device 206 produces a harmonic having the frequency of the difference between the two frequencies (e.g., for 43 GHz and 49 GHz, the difference or repetition frequency is 6 GHz). In the example setup as shown in FIG. 4, the greatest non-linearity of the transistor 410 occurs at a $V_B$ of about 0.85V, but the particular design of the transistor 410 will change the bias voltage that creates the greatest non-linearity. Stated otherwise, the non-linear electrical device 206 intermodulates (or self-mixes) the electrical pulse signal to create the modulated signal. One of ordinary skill in the art, with the benefit of this disclosure, now understands that the non-linear electrical device 206 in the form of transistor 410 is merely an example, and other non-linear electrical devices (e.g., properly biased diodes) may be equivalently used.

The next portion of the example pulse receiver circuit 106 is the electrical filter 208. In particular, the electrical filter 208 is disposed on the substrate 200 (FIG. 2) and defines input leads 420 and an output lead 422. The input leads 420 electrically couple to the non-linear electrical device 206, specifically the output leads 416. In the example system, the electrical trace length between the non-linear electrical device 206 and the electrical filter 208 is 55 µm. Further in example systems, the electrical filter 208 is designed and constructed to filter the modulated signal from the non-linear electrical device 206 to recover a signal having an intermodulated frequency being the repetition frequency of the pulses 110. The signal remaining after the filtering may be referred to as a filtered signal.

In example cases, and as shown in FIG. 4, the electrical filter 208 may be a low-pass filter. More particularly, the electrical filter 208 may be a Chebyshev low-pass filter with a cut-off frequency of about 10 GHz. However, bandpass filters with upper cut-off frequencies of about 10 GHz may be equivalently used. In the example case of FIG. 4, the electrical filter 208 comprises two inductors 424 and 426 coupled in series, each inductor being about 500 pico-Henries (pH). The electrical filter 208 further comprises a first capacitor 428 coupled between the inductors 424 and 426, and a second capacitor 430 coupled downstream of the second inductor 426. In the example case, each capacitor has a capacitance of 1 pico-Farad (pF).

Figure 6:
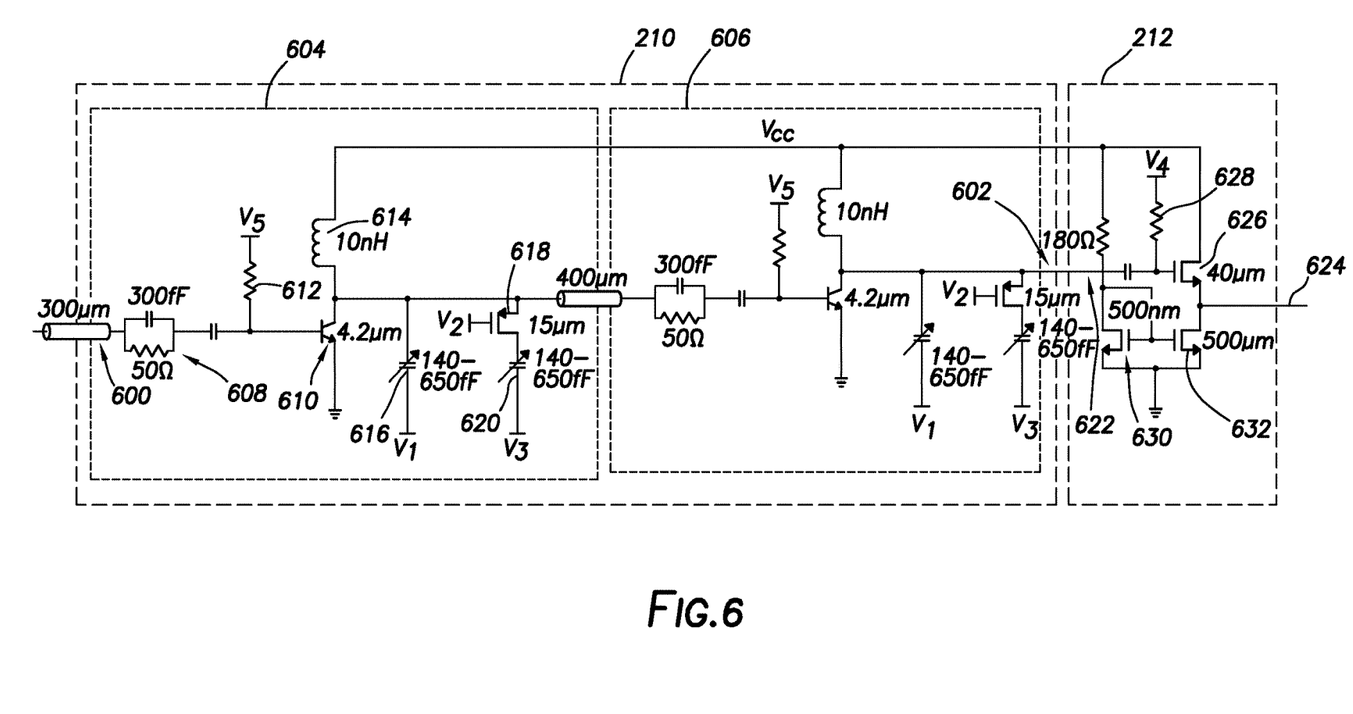
FIG. 6 shows a circuit diagram of a baseband amplifier and buffer circuit in accordance with at least some embodiments.

FIG. 6 shows a circuit diagram of a baseband amplifier 210 and buffer circuit 212 in accordance with at least some embodiments. In particular, the baseband amplifier 210 is disposed on the substrate 200 (FIG. 2), and the baseband amplifier 210 defines an input lead 600 and an output lead 602. The input lead 600 is coupled to the electrical filter 208 (FIGS. 2 and 4) by way of a circuit trace, and in an example case the circuit trace has a length of 300 µm. The example baseband amplifier 210 of FIG. 6 has two stages 604 and 606, but any suitable number of stages may be used. As discussed more below, the baseband amplifier 210 has a tunable center frequency in the range of between 100 MHz and 10 GHz inclusive, and in the example case between 1 GHz and 10 GHz inclusive. In the design shown in FIG. 6, the baseband amplifier has a gain of 27.5 dB when tuned at 5 GHz.

Referring to the first stage 604 as representative of both stages 604 and 606, the first stage 604 has a stabilizing network 608 in the form a parallel connected 50 Ohm resistor 300 femento-Farad (fF) capacitor. Downstream of the stabilizing network 608 resides transistor 610 (here an NPN BJT). In the example first stage 604, the transistor 610 has an emitter width of 4.7 µm. The base of the transistor 610 receives a biasing electrical current by virtue of the base being coupled to a bias voltage $V_5$ by way of resistor 612. In example cases, the bias voltage $V_5$ is externally supplied by way of one of the bond pads (e.g., bond pad 220). The collector of transistor 610 is coupled to $V_{CC}$ by way of an inductor 614 having an inductance of 10 nano-Henries (nH). The drain of transistor 610 is coupled to common or ground. The collector of the transistor 610 is further coupled to variable capacitance to enable the control of the center frequency of the first stage 604 (and thus the baseband amplifier 210).

Still referring to FIG. 6, in the example system the variable capacitance to enable control of the center frequency is implemented in the form of two parallel capacitive networks. The first capacitive network comprises varactor diode 616 (hereafter just varactor 616) to provide selectable capacitance. The varactor 616 is coupled on one side to the collector of the transistor 610, and the varactor 616 is coupled on a second side to a bias voltage $V_1$. In example cases, the bias voltage $V_1$ is externally supplied by way of one of the bond pads (e.g., bond pad 222). Thus, by controlling the bias voltage $V_1$ the capacitance presented by the varactor 616 may be controlled. In the example system, the varactor 616 may provide capacitance in the range of 160 femento-Farads (fF) to 650 fF. Choosing any two capacitances in the range, the varactor 616 may be said to have a first capacitance and a second capacitance, but of course the capacitance may be almost infinitely controlled within the range and thus a plurality of capacitances are possible. The example circuit of FIG. 6 further comprises a second capacitive network comprising switch 618 and a second varactor 620. Switch 618 may be implemented as a metal oxide semiconductor (MOS) field effect transistor (FET) having its gate coupled to an externally accessible bond pad, and its source and drain coupled between the emitter of the transistor 610 and varactor 620. Thus, by application of an externally supplied voltage $V_2$ to one of the bond pads (e.g., bond pad 224) and thus the gate, the switch 618 may selectively couple (and decouple) the varactor 620 and the emitter of the transistor 610. The varactor 620 is coupled on a second side to a bias voltage $V_3$. In example cases, the bias voltage $V_3$ is externally supplied by way of one of the bond pads (e.g., bond pad 226). Thus, by controlling the bias voltage $V_3$ the capacitance presented by the varactor 620 may be controlled. In the example system, the varactor 616 may provide capacitance in the range of 160 fF to 650 fF. It follows that the ranges of the capacitances provided by the varactors 616 and 620, as well as the ability to selectively couple and decouple the varactor 620, the center frequency of the first stage 604 may be controlled, and in the example system controlled in the range of 1 GHz to 10 GHz.

Before describing the buffer circuit 212, it is noted that the first stage 604 and the second stage 606 of the baseband amplifier 210 are shown connected by way of an electrical trace of length 400 µm; however, the length of the electrical trace to connect the two stages was dictated by physical placement of the stages on the test circuit, and thus separating the stages is not required.

FIG. 6 further shows the buffer circuit 212. In particular, the buffer circuit 212 is disposed on the substrate 200 (FIG. 2), and the buffer circuit 212 defines an input lead 622 and an output lead 624. The input lead 622 is coupled to output lead 602 of the baseband amplifier 210, and the output lead 624 is coupled to the bond bad 214 (FIG. 2). The buffer circuit 212 is configured to drive a downstream electrical load coupled to the output lead, where the downstream electrical load has an impedance of around 50 Ohms. The main element of the buffer circuit 212 is a MOSFET 626 having a drain width of 40 µm. The gate of the MOSFET 626 is electrically coupled to the input lead 622 by way of a DC blocking capacitor (not specifically numbered). The gate of the MOSFET 626 receives a bias voltage by virtue of the gate being coupled to a bias voltage $V_4$ by way of resistor 628. In example cases, the bias voltage $V_4$ is externally supplied by way of one of the bond pads (e.g., bond pad 228). The collector of the MOSFET 626 is coupled to $V_{CC}$, and the drain is coupled to the output lead 624.

In order to help control the impedance of the buffer circuit 212 presents on the drain of the MOSFET 626 (and the output lead 624), the example buffer circuit implements FETs 630 and 632. In particular, the gates of FETs 630 and 632 are coupled together, and the gates are coupled to the drain of the FET 630. The collector of FET 630 couples to VCC through a 180 Ohm resistor (not specifically numbered), and the drain of FET 630 couples to common or ground.

In a test pulse receiver circuit 106 created as shown on the various drawings and discussed, the pulse receiver circuit 106 was able to extract and create the clock signal 112. In an example situation, the periodic signal 108 had a frequency of 48 GHz and a jitter of 360 femento-seconds (fsec), and a repetition rate of the pulses was set at 2.0 GHz by simultaneously broadcasting a 46 GHz signal and 48 GHz signal, with each of the 46 GHz signals having a power set at 10 dBm and broadcast horns at a distance 10 cm from the pulse receiver circuit 106. The pulse receiver circuit 106 constructed as discussed herein extracted the clock signal 112 at a frequency of 2.0 GHz and a jitter of 376 fsec. For the particular setup described, the output power of the pulse receiver circuit 106 showed a straight line correlation to input power until saturation occurred at about 18 dBm fed to the broadcast horns.

Figure 7:
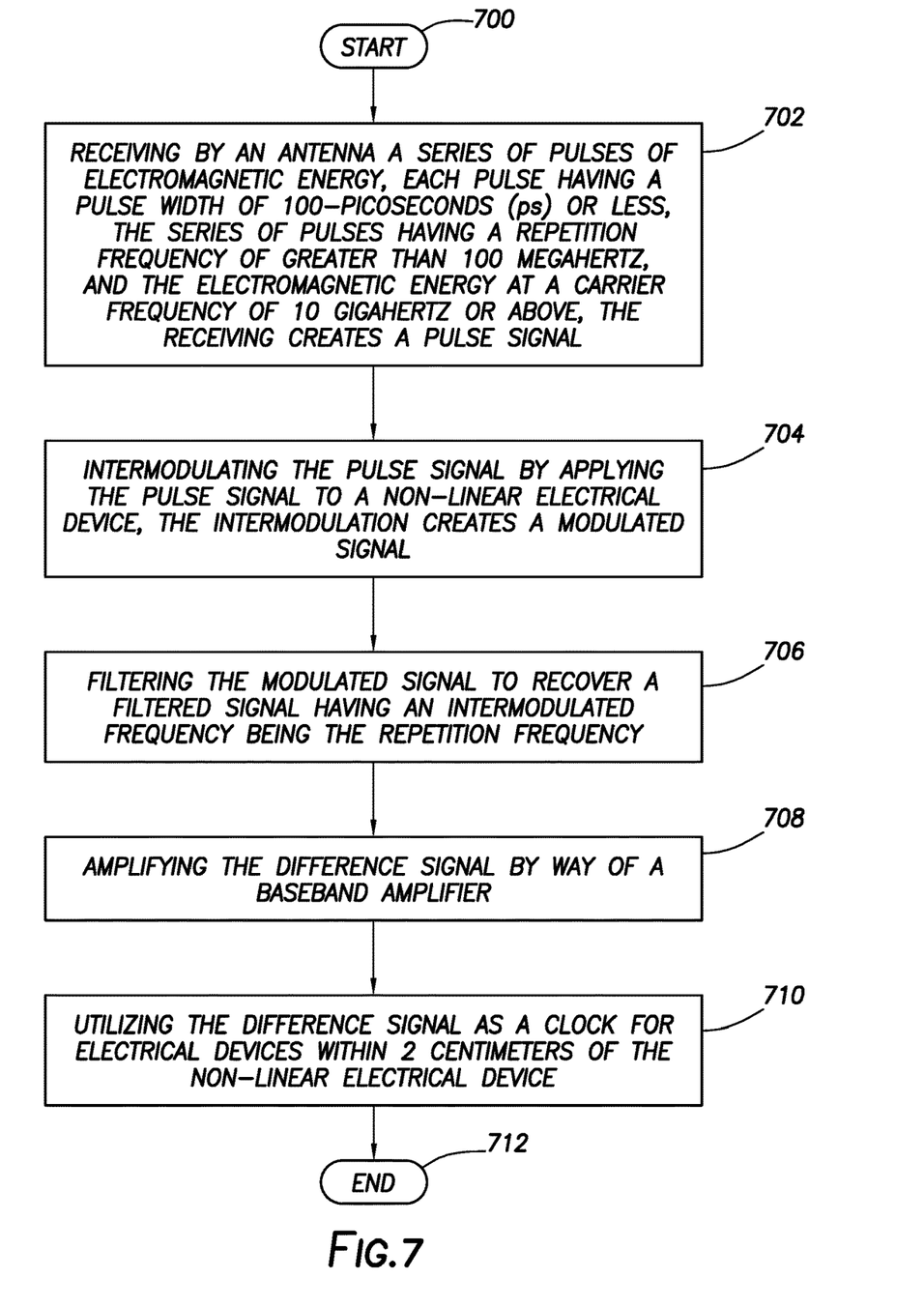
FIG. 7 shows a method in accordance with at least some embodiments.

FIG. 7 shows a method in accordance with at least some embodiments. In particular, the method starts (block 700) and comprises: receiving by an antenna a series of pulses of electromagnetic energy, each pulse having a pulse width of 100 picoseconds (ps) or less, the series of pulses having a repetition frequency of greater than 1 Mega-Hertz, and the electromagnetic energy at a carrier frequency of 10 Giga-Hertz or above, the receiving creates a pulse signal (block 702); intermodulating the pulse signal by applying the pulse signal to a non-linear electrical device, the intermodulation creates a modulated signal (block 704); filtering the modulated signal to recover a filtered signal having an intermodulated frequency being the repetition frequency (block 706); amplifying the difference signal by way of a baseband amplifier (block 708); and utilizing the filtered signal as a clock for electrical devices within 2 centimeters of the non-linear electrical device (block 710). Thereafter, the method ends (block 712).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
   detecting by an antenna, electromagnetic waves incident upon the antenna, the electromagnetic waves in the form of a series of pulses, each pulse having a pulse width of 100 picoseconds (ps) or less, the series of pulses having a repetition frequency of greater than 100 Mega-Hertz, and the electromagnetic waves at a carrier frequency of 10 GigaHertz (GHz) or above, the receiving creates a pulse signal in electrical conductors directly coupled to the antenna;
   intermodulating the pulse signal by applying the pulse signal to a non-linear electrical device, the intermodulation creates a modulated signal; and
   filtering the modulated signal to recover a filtered signal having an intermodulated frequency being the repetition frequency.

2. The method of claim 1, wherein the receiving further comprises receiving by way of a broadband antenna.

3. The method of claim 1, wherein the receiving further comprises receiving by way of a bow-tie antenna having a resonant frequency of about 50 GHz.

4. The method of claim 1, wherein the intermodulating further comprises applying the pulse signal to a NPN transistor biased into a non-linear region.

5. The method of claim 1 further comprising amplifying the filtered signal by way of a baseband amplifier.

6. The method of claim 5, wherein amplifying the filtered signal further comprises setting a center frequency of the baseband amplifier within a range of frequencies between about 1 GHz and about 10 GHz, the setting by applying a voltage to a varactor diode.

7. The method of claim 1, wherein the filtering further comprises low-pass filtering with a filter having a cut-off frequency of about 10 GHz.

8. The method of claim 7, wherein the low-pass filtering further comprises filtering with a fourth order Chebyshev low-pass filter.

9. The method of claim 1 further comprising utilizing the filtered signal as a clock for electrical devices within 2 centimeters of the non-linear electrical device.

10. The method of claim 1, wherein receiving the series of pulses of electromagnetic energy further comprises receiving the series of pulses each pulse having a pulse width of about 8 ps.

11. An electrical device comprising:
   a substrate that defines a length and width;
   an antenna disposed on the substrate, the antenna has a center frequency above 10 GigaHertz (GHz), the antenna configured to detect a series of pulses of electromagnetic waves, the series of pulses having a repetition frequency of greater than 100 Mega-Hertz, and the detection creates a pulse signal;

a broadband amplifier disposed on the substrate, the broadband amplifier defines an input lead and an output lead, the input lead coupled to the antenna;

a non-linear electrical device disposed on the substrate, the non-linear electrical device defines an input lead and an output lead, the input lead of the non-linear electrical device coupled to the output lead of the broadband amplifier, the non-linear electrical device configured to self-mix the pulse signal and thereby create a modulated signal;

an electrical filter disposed on the substrate, the electrical filter defines an input lead and an output lead, the input lead of the electrical filter coupled to the output lead of the non-linear electrical device, and the electrical filter has upper cutoff frequency of about 10 GHz, the electrical filter configured to filter the modulated signal and thereby recover a clock signal having a frequency being the repetition rate; and a baseband amplifier disposed on the substrate, the baseband amplifier defines an input lead and an output lead, the input lead of the baseband amplifier coupled to the output lead of the electrical filter.

12. The electrical device of claim 11, wherein the antenna further comprises a bow-tie antenna, and the center frequency of the bow-tie antenna is about 50 GHz.

13. The electrical device of claim 12, wherein the broadband amplifier has a peak gain of 28 deci-Bells (dB) in the frequency range of about 40 GHz to about 60 GHz.

14. The electrical device of claim 11, wherein the non-linear electrical device further comprises:

an NPN transistor on the substrate that defines a base, a collector, and an emitter, the base defines the input lead of the non-linear electrical device, the collector defines the output lead; and a resistor defined on the substrate, the resistor coupled between a voltage rail and the base, the resistor has a resistance configured to provide current to the base to bias the NPN transistor into a non-linear region of the NPN transistor.

15. The electrical device of claim 11, wherein the electrical filter further comprises a low-pass filter.

16. The electrical device of claim 15, wherein the low-pass filter further comprises a $4^{th}$ order Chebyshev low-pass filter.

17. The electrical device of claim 11, wherein the baseband amplifier further comprises:

an inductor defined on the substrate; and a varactor diode defined on the substrate, the varactor diode coupled to the inductor, and the varactor diode defines a first capacitance and a second capacitance;

wherein the baseband amplifier is configured to have a first center frequency at the first capacitance, and a second center frequency at the second capacitance, the first center different than the second center frequency.

18. The electrical device of claim 11, wherein the baseband amplifier further comprises a plurality of stages, and the baseband amplifier is configured to have a selectable first center frequency and second center frequency, the first center frequency different than the second center frequency.

19. The electrical device of claim 11, wherein the length and width of the substrate are each 2.0 millimeters or less.

20. The electrical device of claim 11, further comprising a buffer circuit disposed on the substrate, the buffer circuit defines an input lead and an output lead, the input lead of the buffer circuit coupled to the output lead of the baseband amplifier, and buffer circuit configured to drive a load along the output lead of the buffer circuit of about 50 Ohms.

* * * * *